United States Patent
Choi

(10) Patent No.: US 10,020,070 B2
(45) Date of Patent: Jul. 10, 2018

(54) SEMICONDUCTOR MEMORY DEVICE AND METHOD OF OPERATING THE SAME

(71) Applicant: SK hynix Inc., Gyeonggi-do (KR)

(72) Inventor: Hoon Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/416,268

(22) Filed: Jan. 26, 2017

(65) Prior Publication Data

US 2018/0090224 A1  Mar. 29, 2018

(30) Foreign Application Priority Data

Sep. 23, 2016 (KR) .................. 10-2016-0122210

(51) Int. Cl.
| | |
|---|---|
| G11C 7/00 | (2006.01) |
| G11C 29/12 | (2006.01) |
| G11C 16/34 | (2006.01) |
| G11C 16/08 | (2006.01) |
| G11C 16/26 | (2006.01) |
| G11C 16/10 | (2006.01) |
| G11C 7/22 | (2006.01) |

(52) U.S. Cl.
CPC .......... *G11C 29/1201* (2013.01); *G11C 16/08* (2013.01); *G11C 16/10* (2013.01); *G11C 16/26* (2013.01); *G11C 16/3459* (2013.01); *G11C 7/22* (2013.01)

(58) Field of Classification Search
CPC .................................................. G11C 29/1201
See application file for complete search history.

(56) References Cited

U.S. PATENT DOCUMENTS

| | | | | |
|---|---|---|---|---|
| 2007/0070669 | A1* | 3/2007 | Tsern ................... | G11C 5/02 365/51 |
| 2014/0369127 | A1* | 12/2014 | Hara ................... | G11C 16/0408 365/185.17 |

FOREIGN PATENT DOCUMENTS

| | | |
|---|---|---|
| KR | 1020150116176 | 10/2015 |
| KR | 1020160034519 | 3/2016 |

* cited by examiner

*Primary Examiner* — Uyen B Tran
(74) *Attorney, Agent, or Firm* — IP & T Group LLP

(57) ABSTRACT

Provided herein are a semiconductor memory device and a method of operating the same. The semiconductor memory device includes: a memory cell array including a plurality of memory cells; a peripheral circuit configured to control the memory cell array, the peripheral circuit including a first region disposed under the memory cell array and a second region; and a fall sensing unit configured to sense whether a failure has occurred in the first or the second regions.

13 Claims, 13 Drawing Sheets

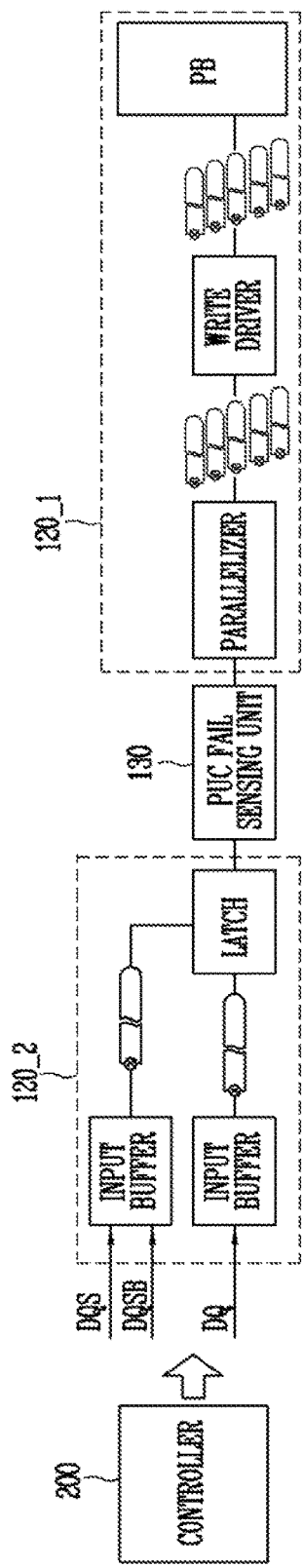
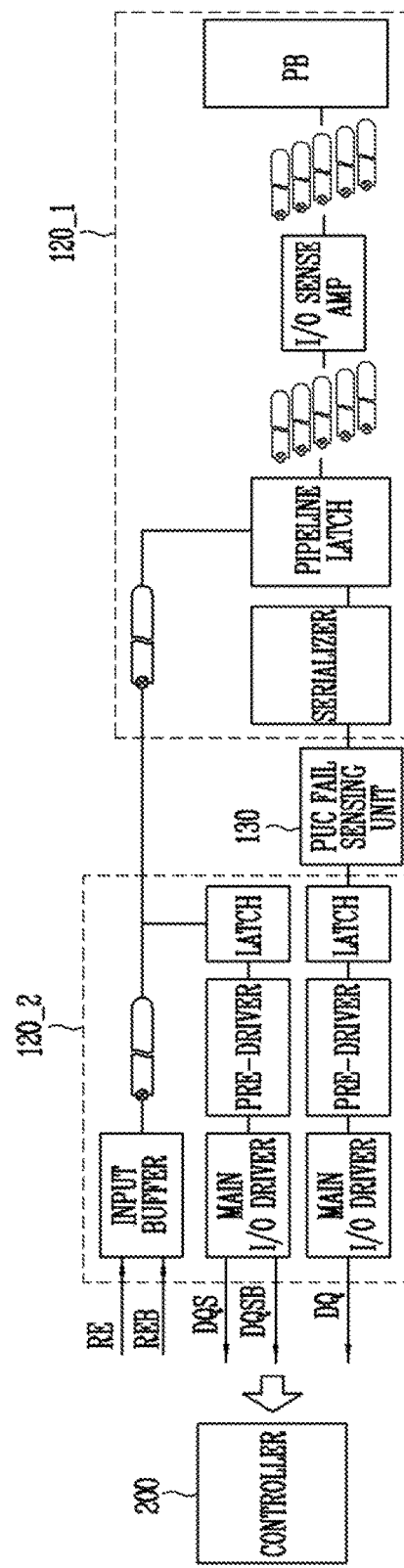

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0122210, filed on Sep. 23, 2016, the entire disclosure of which is incorporated herein by reference in its entirety.

BACKGROUND

Field of Invention

Various embodiments of the present disclosure relate to an electronic device, and more particularly, to a semiconductor memory device and a method of operating the semiconductor memory device.

Description of Related Art

Semiconductor memory devices are data storage devices realized on a semiconductor based integrated circuit. Various semiconductors may be used such as, for example, silicon (Si), germanium (Ge), gallium arsenide (GaAs), and indium phosphide (InP). Semiconductor memory devices are classified into volatile and nonvolatile memory devices.

A volatile memory device is a memory device in which data stored therein is lost when power is turned off. Representative examples of a volatile memory device include a static RAM (SRAM), a dynamic RAM (DRAM), and a synchronous DRAM (SDRAM). A nonvolatile memory device is a memory device in which data stored therein is maintained even when power is turned off. Representative examples of a nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). Flash memory is typically classified into NOR and NAND flash memory.

SUMMARY

Various embodiments of the present disclosure are directed to a semiconductor memory device capable of sensing a failure of a region in a peripheral circuit, and a method of operating the semiconductor memory device.

One embodiment of the present disclosure provides a semiconductor memory device including: a memory cell array including a plurality of memory cells; a peripheral circuit configured to control the memory cell array, the peripheral circuit including a first region disposed under the memory cell array and a second region; and a fail sensing unit configured to sense whether a failure has occurred in the first or the second regions.

Another embodiment of the present disclosure provides a method of operating a semiconductor memory device, including a memory cell array, a peripheral circuit having a first region disposed under the memory cell array and a second region and configured to control the memory cell array, and a fall sensing unit provided between the first and second regions and configured to perform a fall check operation, the method comprising: performing a read operation of reading data from a selected memory cell; and performing a fail check operation of sensing that a failure in which one of the first and second regions when the read operation fails.

BRIEF DESCRIPTION OF THE DRAWINGS

The above and other features and advantages of the present invention will become more apparent to those skilled in the art to which the present invention belongs by the following detailed description with reference to the attached drawings in which:

FIG. 10 is a diagram illustrating operations of the PUC region and the non-PUC region during a program operation of the semiconductor memory device, in accordance with an embodiment of the present disclosure;

FIG. 11 is a diagram illustrating operations of the PUC region and the non-PUC region during a read operation of the semiconductor memory device, in accordance with an embodiment of the present disclosure;

DETAILED DESCRIPTION

Figure 1:
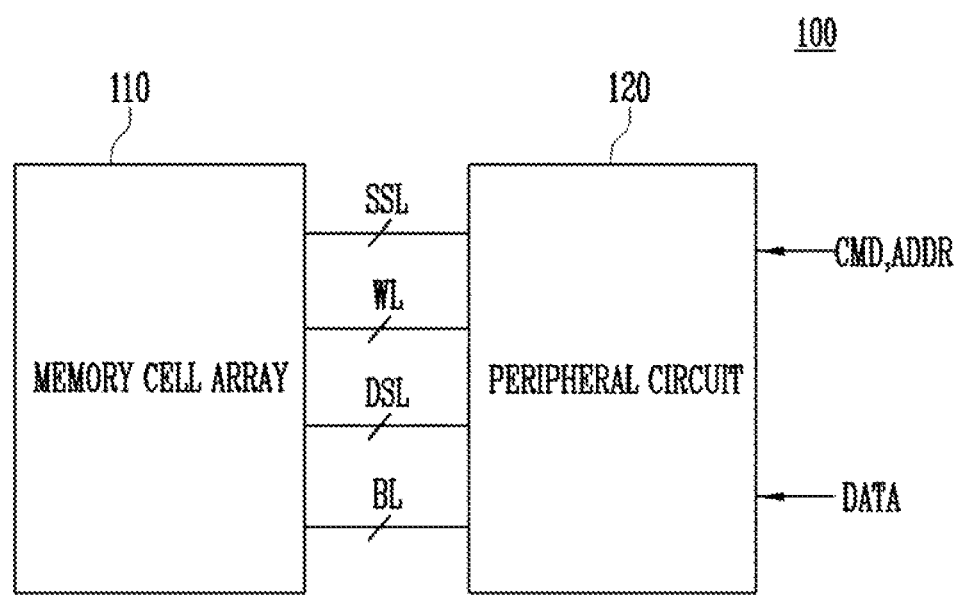
FIG. 1 is a block diagram illustrating a semiconductor memory device comprising a memory cell array operatively coupled to a peripheral circuit, in accordance with an embodiment of the present disclosure.

Example embodiments will now be described more fully hereinafter with reference to the accompanying drawings; however, we note that the present invention may be embodied in different forms and should not be construed as limited only to the embodiments set forth herein. Rather, these embodiments are provided so that this disclosure will be thorough and complete, and will fully convey the present invention to those skilled in the art to which the present invention pertains.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

It is further noted, that the drawings are simplified schematic illustrations of various embodiments and intermediate structures thereof. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned otherwise in the disclosure.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as Illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "Including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the related art and the present disclosure, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described in detail by describing exemplary embodiments of the present disclosure with reference to the attached drawings.

FIG. 1 is a block diagram illustrating a semiconductor memory device 100, in accordance with an embodiment of the present disclosure.

Referring to FIG. 1, the semiconductor memory device 100 may include a memory cell array 110 and a peripheral circuit 120.

The semiconductor memory device 100 may take many alternative forms, such as a NAND flash memory, a vertical NAND flash memory, a NOR flash memory device, a resistive random access memory (RRAM), a phase-change memory (PRAM), a magneto-resistive random access memory (MRAM), a ferroelectric random access memory (FRAM), or a spin transfer torque random access memory (STT-RAM). The semiconductor memory device 100 may have a three-dimensional array structure. The present disclosure may be applied to a flash memory in which a charge storage layer is formed of a conductive floating gate (FG). The present disclosure may also be applied to a charge trap flash (CTF) memory in which a charge storage layer is formed of an insulating layer such as, for example, a silicon nitride layer.

The semiconductor memory device 100 includes the memory cell array 110 and the peripheral circuit 120 for driving the memory cell array 110. The memory cell array 100 includes a plurality of memory cells. Preferably, the memory cell array 100 may include a plurality of nonvolatile memory cells.

The memory cell array 110 and the peripheral circuit 120 may be coupled to each other through source select lines SSL, word lines WL, drain select lines DSL and bit lines BL.

In operation, the peripheral circuit 120 may receive a command CMD and an address ADDR from an external device.

The peripheral circuit 120 may control the memory cell array 110 in response to a command CMD received from the external device. For example, the peripheral circuit 120 may program data to the memory cell array 110, may read data from the memory cell array 110 and/or erase data from the memory cell array 110. In an embodiment, the read and/or program operation of the semiconductor memory device 1000 may be performed on a page basis, whereas the erase operation may be performed on a memory block basis.

During a program operation, the peripheral circuit 120 may receive a command CMD indicating the program operation, an address ADDR, and data DATA from the external device. The peripheral circuit 120 may program the received data DATA to a page of a memory block which are selected based on the received address ADDR.

During a read operation, the peripheral circuit 120 may receive a command CMD indicating the read operation, and an address ADDR. The peripheral circuit 120 may read data from a page of a memory block selected based on the received address ADDR, and may output the read data (hereinafter referred to also as "page data") to the external device.

During an erase operation, the peripheral circuit 120 may receive a command CMD indicating the erase operation and an address ADDR from the external device. The peripheral circuit 120 may erase data from a memory block which is selected based on the received address ADDR.

The command CMD, the address ADDR and data DATA may be transmitted to or received from the external device through an input/output pad (not shown). In an embodiment, the distance of a path between the input/output pad and the peripheral circuit 120 may be reduced, in order to increase the operating speed of the peripheral circuit 120.

Figure 2:
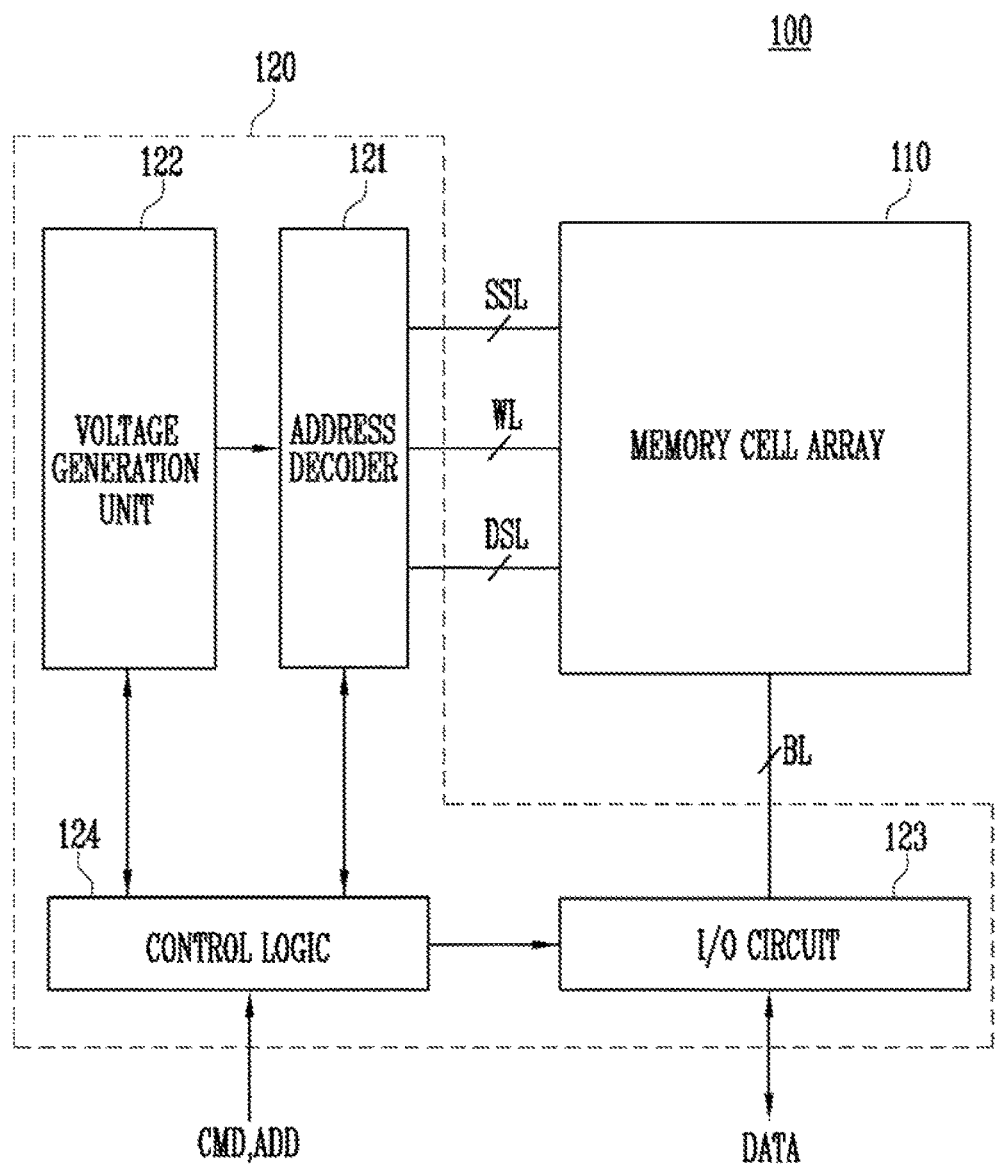
FIG. 2 is a block diagram illustrating an embodiment of the peripheral circuit of the semiconductor memory device of FIG. 1.

FIG. 2 is a block diagram illustratively showing a more detailed configuration of the semiconductor memory device 100 of FIG. 1, according to an embodiment of the present invention.

Referring to FIG. 2, the semiconductor memory device 100 may include the memory cell array 110 and the peripheral circuit 120. The peripheral circuit 120 may include an address decoder 121, a voltage generation unit 122, an input/output circuit 123, and a control logic 124.

The memory cell array 110 may be coupled to the address decoder 121 through source select lines SSL, word lines WL, and drain select lines DSL and may be coupled to the input/output circuit 123 through bit lines BL.

The memory cell array 110 may include a plurality of memory blocks. Memory cells of each memory block may form a two-dimensional structure. Furthermore, the memory cells of each memory block may be stacked in a direction perpendicular to a substrate to form a three-dimensional structure. Each memory block may include a plurality of memory cells and a plurality of select transistors. The memory cells may be coupled to the word lines WL. The select transistors may be coupled to the source select lines SSL or the drain select lines DSL. Memory cells coupled to the same word line may be defined as one page. In other words, the memory cell array 110 is formed of a plurality of pages.

Each of the memory cells included in the memory cell array 110 may be formed of a single level cell (SLC) capable of storing a single data bit, or a multi-level cell (MLC) capable of storing two or more data bits. Examples of MLC cells include a two-level cell capable of storing two data bits, a triple-level cell (TLC) capable of storing three data bits, or a quad-level cell (QLC) capable of storing four data bits.

Figure 3:
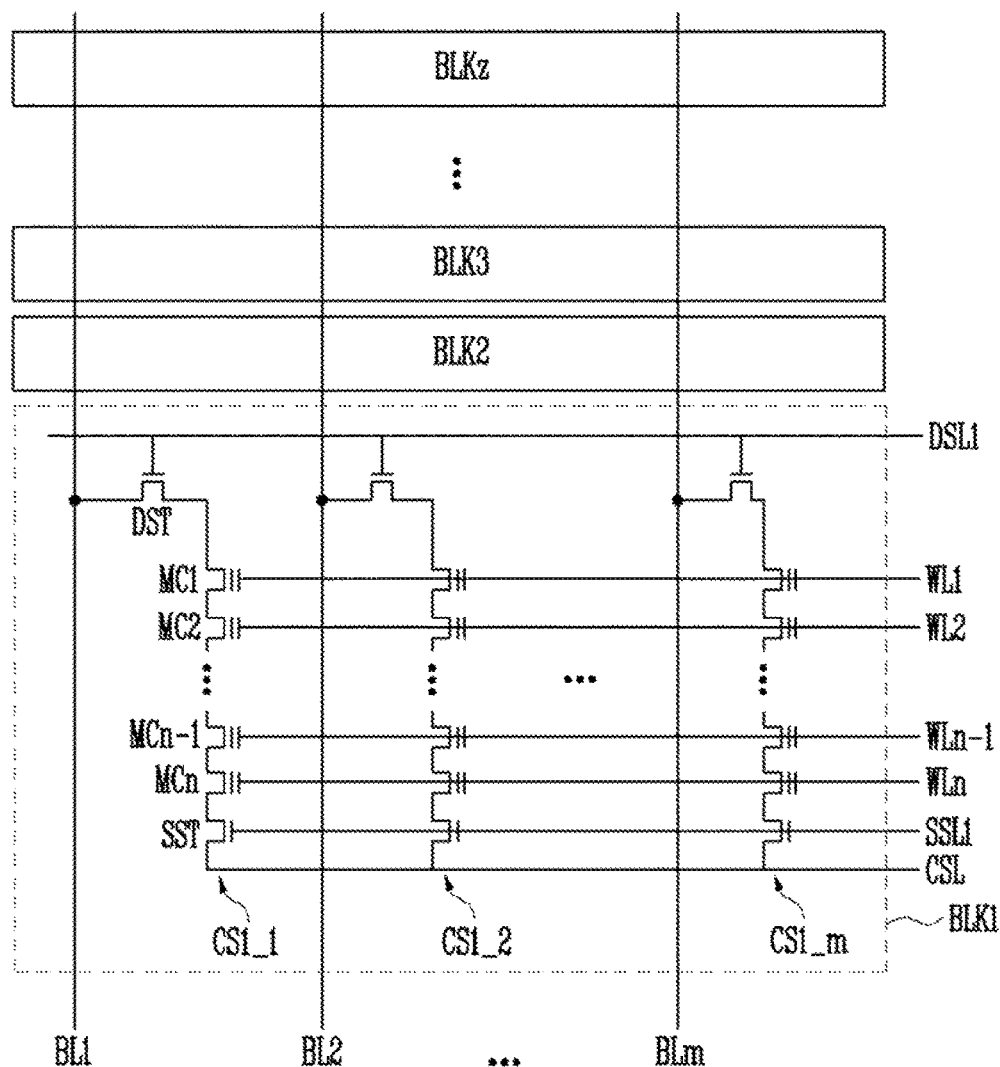
FIG. 3 is a diagram illustrating an embodiment of the memory cell array of the semiconductor memory device of FIG. 1.

FIG. 3 is a diagram illustrating an embodiment of the memory cell array 110 generally designated by numeral 110_1.

Referring to FIG. 3, first to z-th memory blocks BLK1 to BLKz included in the memory cell array 110_1 are coupled in common to first to m-th bit lines BL1 to BLm. In FIG. 3, for the sake of explanation, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 includes a plurality of cell strings CS1_1 to CS1_m). The first to m-th cell strings CS1_1 to CS1-m are respectively coupled to the first to m-th bit lines BL1 to BLm.

Each of the first to m-th cell strings CS1_1 to CS1_m includes a drain select transistor DST, a plurality of memory cells MC1 to MCn which are coupled in series to each other, and a source select transistor SST. The gate of the drain select transistor DST of each of the first to m-th cell strings CS1_1 to CS1_m is coupled to a common drain select line DSL1. The gates of the first to n-th memory cells MC1 to MCn of each of the first to m-the cell strings CS1_1 to CS1_m are respectively coupled to first to n-th word lines WL1 to WLn. The gate of the source select transistor SST of each of the first to m-th cell strings CS1_1 to CS1_m is coupled to a common source select line SSL1. A drain of the drain select transistor DST of each of the first to m-the cell strings CS1_1 to CS1_m is coupled to a corresponding bit line. Hence, the drain select transistors of the first to m-th cell strings CS1_1 to CS1_m are respectively coupled to the first to m-th bit lines BL1 to BLm. A source of the source select transistor SST of each of the first to m-the cell strings CS1_1 to CS1_m is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are controlled by the address decoder 121. The common source line CSL is controlled by the control logic 124. The first to m-th bit lines BL1 to BLm are controlled by the read/write circuit 123.

Referring again to FIG. 2, the peripheral circuit 120 may include the address decoder 121, the voltage generation unit 122, the input/output circuit 123, and the control logic 124.

The peripheral circuit 120 may drive the memory cell array 110. For example, the peripheral circuit 120 may drive the memory cell array 110 so that a program operation, a read operation, and/or an erase operation are performed.

The address decoder 121 may be coupled to the memory cell array 110 through the string select lines SSL, the word lines WL, and drain select lines DSL. The address decoder 121 may be configured to operate in response to control of the control logic 124. The address decoder 121 receives addresses ADDR from the control logic 124 through an input buffer (not shown) included in the semiconductor memory device 100. The address decoder 121 is configured to decode a block address from the received address ADDR. The address decoder 121 selects a memory block in response to the decoded block address. The address decoder 121 is configured to also decode a row address among the received addresses ADDR. Using the decoded row address, the address decoder 121 may select a source select line SSL, a word line WL, and a drain select line DSL. The address decoder 121 may receive various voltages from the voltage generation unit 122 and transmit the received voltages to selected and unselected source select lines SSL, word lines WL and drain select lines DSL as may be needed depending upon a particular operation.

During a program operation, the address decoder 121 may apply a program voltage to a selected word line and apply a pass voltage having a level lower than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, the address ADDR inputted to the semiconductor memory device 100 includes a block address. The address decoder 121 may decode the block address and select a corresponding one memory block in response to the decoded block address. During an erase operation, the address decoder 121 may apply a ground voltage to the word lines which are coupled to the selected memory block.

The address decoder 121 may be configured to decode a column address among the received addresses ADDR. A decoded column address DCA may be transmitted to the read/write circuit 123. In an exemplary embodiment, the address decoder 121 may include components such as a row decoder, a column decoder, and an address buffer.

The voltage generation unit 122 is configured to generate a plurality of voltages using an external supply voltage provided to the semiconductor memory device 100. The voltage generation unit 122 may be operated under the control of the control logic 124 to generate the plurality of voltages as may be needed for each operation.

In an embodiment, the voltage generation unit (122) may generate an internal supply voltage by regulating the external supply voltage. The internal supply voltage generated by the voltage generation unit 122 is used as an operating voltage for the semiconductor memory device 100.

In an embodiment, the voltage generation unit 122 may generate a plurality of voltages using an external supply voltage or an internal supply voltage. The voltage generator 122 may be configured to generate various voltages required by the semiconductor memory device 100. For example, the voltage generation unit 122 may generate a plurality of program voltages, a plurality of pass voltages, a plurality of select read voltages, and a plurality of unselect read voltages as may be needed For example, the voltage generation unit 122 may include a plurality of pumping capacitors for receiving the internal supply voltage and generate a plurality of voltages by selectively enabling the plurality of pumping capacitors under the control of the control logic 124.

The generated voltages may be supplied to the memory cell array 110 by the address decoder 200.

The input/output circuit 123 is coupled to the memory cell array 110 through the bit lines BL and may exchange data DATA with the external device. The input/output circuit 123 may be operated under the control of the control logic 124. The input/output circuit 123 may be configured to receive a decoded column address from the address decoder 121. The input/output circuit 123 may select bit lines BL using the decoded column address.

In an embodiment, the input/output circuit 123 may receive data from the external device and program the received data to the memory cell array 110. The input/output circuit 123 may read data from the memory cell array 110 and transmit the read data to the outside. The input/output circuit 123 may read data from a first storage region of the memory cell array 110 and write the read data in a second storage region of the memory cell array 110. For example, the input/output circuit 123 may be configured to perform a copy-back operation.

In an embodiment, the input/output circuit 123 may include a plurality of page buffers. The plurality of page buffers may be coupled to the memory cell array 110 through corresponding bit lines. The plurality of page buffers may be operated under the control of the control logic 124.

During a program operation, the plurality of page buffers may transmit received data DATA to selected memory cells through the bit lines when a program pulse is applied to each selected word line. The memory cells in the selected page are programmed based on the transmitted data DATA. Memory cells coupled to a bit line to which a program enable voltage (for example, a ground voltage) is applied may have increased threshold voltages. Threshold voltages of memory cells coupled to a bit line to which a program inhibit voltage (for example, a supply voltage) is applied may be maintained. During a program verify operation, the plurality of page buffers read page data from the selected memory cells through the bit lines.

During a read operation, the input/output circuit 123 reads data DATA from the memory cells in the selected page through the bit lines BL, and outputs the read data DATA to the outside.

During an erase operation, the input/output circuit 123 may float the bit lines BL.

In an embodiment, the input/output circuit 123 may include components such as a page buffer (or a page register), a column select circuit, and a data buffer. In another embodiment, the input/output circuit 123 may include components such as a sense amplifier, a write driver, a column select circuit, and a data buffer.

The control logic 124 may be coupled to the address decoder 121, the voltage generation unit 122, and the input/output circuit 123. The control logic 124 may be configured to control the overall operation of the semiconductor memory device 100. The control logic 124 may be operated in response to a command CMD transmitted from the external device.

Figure 4:
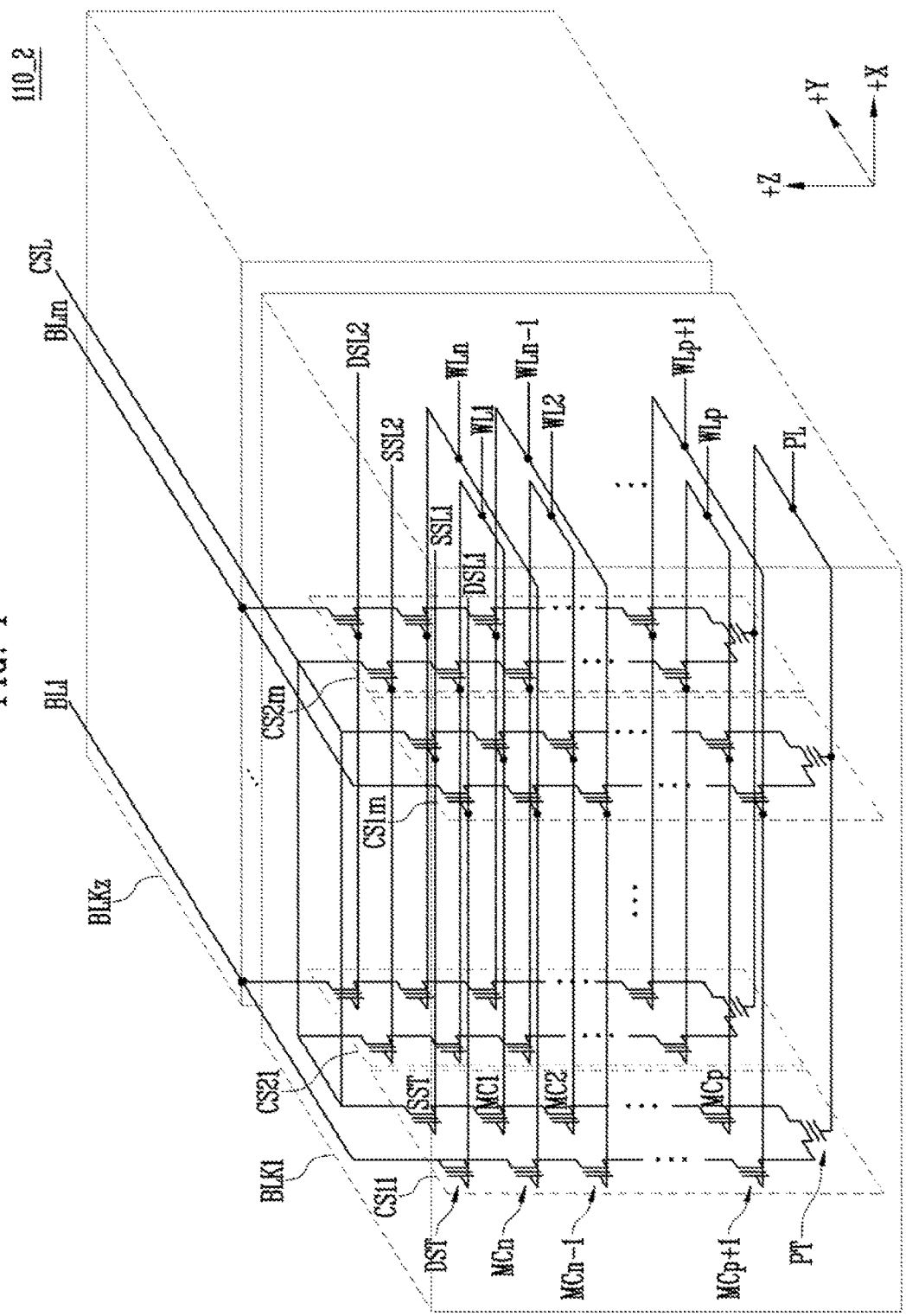
FIG. 4 illustrates another embodiment of the memory cell array of the semiconductor memory device of FIG. 1.

FIG. 4 illustrates another embodiment of the memory cell array 110 generally designated by numeral 110_2.

Referring to FIG. 4, a memory cell array 110_2 includes a plurality of memory blocks BLK1 to BLKz. In FIG. 4, for the sake of description, the internal configuration of the first memory block BLK1 is illustrated, and the internal configuration of the other memory blocks BLK2 to BLKz is omitted. It will be understood that each of the second to z-th memory blocks BLK2 to BLKz has the same configuration as that of the first memory block BLK1.

Referring to FIG. 4, the first memory block BLK1 includes a plurality of cell strings CS11 to CS1m and CS21 to CS2m. In the illustrated embodiment of FIG. 4, each of the cell strings CS11 to CS1m and CS21 to CS2m may be formed in a 'U' shape. In the first memory block BLK1, an m number of cell strings are arranged in a row direction (i.e. a positive (+) X direction). In FIG. 4, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST arranged in series in the recited order.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is coupled between the common source line CSL and the memory cells MC1 to MCp.

In the illustrated embodiment of FIG. 4, the gates of source select transistors of cell strings arranged in the same row are coupled to a source select line extending in a row direction, and the gates of source select transistors of cell strings arranged in different rows are coupled to different source select lines. For example, as illustrated in FIG. 4, the gates of the source select transistors of cell strings CS11 to CS1m in a first row are coupled to a first source select line SSL1 whereas the gates of the source select transistors of cell strings CS21 to CS2m in a second row are coupled to a second source select line SSL2.

In another embodiment, the gates of the source select transistors of the cell strings CS11 to CS1m and the gates of the source select transistors of the cell strings CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When a dummy memory cell is provided in a cell string, the voltage or current of the corresponding cell string may be more stably controlled, thereby improving the reliability of data stored in the memory block BLK1.

The gates of the respective pipe transistors PT of the cell strings are coupled to a pipeline PL.

The drain select transistor DST of each cell string is coupled between the corresponding bit line and the memory cells MCp+1 to MCn. The cell strings in a row direction are coupled to drain select lines extending in a row direction. More specifically, the gates of the drain select transistors of cell strings CS11 to CS1m in the first row are coupled to a first drain select line DSL1 and the gates of the drain select transistors of cell strings CS21 to CS2m in the second row are coupled to a second drain select line DSL2.

Cell strings arranged in a column direction are coupled to bit lines extending in a column direction. More specifically, as illustrated in FIG. 4, cell strings CS11 and CS21 in a first column are coupled to a first bit line BL1, whereas cell strings CS1m and CS2m in an m-th column are coupled to an m-th bit line BLm.

Memory cells coupled to the same word line in cell strings arranged in a row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. A single page may be selected from the selected cell strings by selecting any one of the word lines WL1 to WLn.

Figure 5:
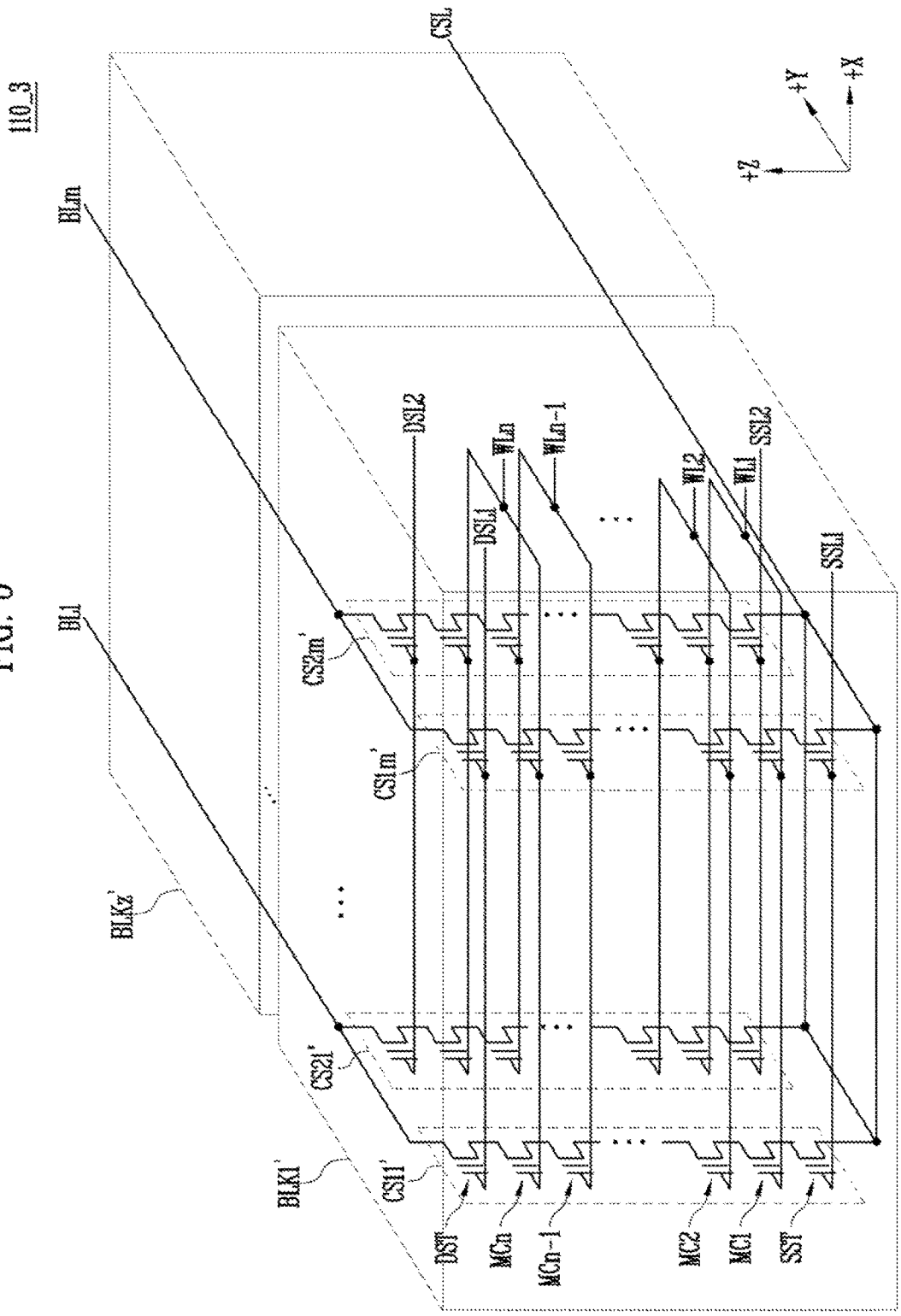
FIG. 5 illustrates still another embodiment of the memory cell array of the semiconductor memory device of FIG. 1.

FIG. 5 illustrates still another embodiment of the memory cell array 110 generally designated by numeral 110_3.

Referring to FIG. 5, a memory cell array 110_3 includes a plurality of memory blocks BLK1' to BLKz'. In FIG. 5, for the sake of description, the internal configuration of the first memory block BLK1' is illustrated, and the internal configuration of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'. Each of the plurality of cell strings CS11' to CS1m' and CS21' to CS2m' extends in a +Z direction. In the first memory block BLK1', an m number of cell strings are arranged in a +X direction. In FIG. 5, two cell strings are shown as being arranged in a +Y direction. However, this illustration is made for convenience of description, and it will be understood that three or more cell strings may be arranged in the column direction.

Each of the plurality of cell strings CS11' to CS1m' and CS21' to CS2m' includes at least one source select transistor SST, first to n-th memory cells MC1 to MCn, and at least one drain select transistor DST arranged in series in the recited order.

The source select transistor SST of each cell string is coupled between the common source line CSL and the memory cells MC1 to MCn. The source select transistors of cell strings arranged in the same row are coupled to the same source select line. More specifically, the gates of the source select transistors of cell strings CS11' to CS1m' arranged in a first row are coupled to a first source select line SSL1, whereas the gates of the source select transistors of cell strings CS21' to CS2m' arranged in a second row are coupled to a second source select line SSL2. In a variation of this embodiment (not shown), the gates of the source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

In an embodiment, at least one of the first to n-th memory cells MC1 to MCn may be used as a dummy memory cell. When a dummy memory cell is provided in a cell string, the voltage or current of the corresponding cell string may be controlled more stably, thereby improving the reliability of data stored in the memory block BLK1.

The drain select transistor DST of each cell string is coupled between the corresponding bit line and the memory cells MC1 to MCn. The gates of drain select transistors of cell strings arranged in a row direction are coupled to drain select lines extending in a row direction. More specifically, the gates of the drain select transistors of cell strings CS11' to CS1m' in the first row are coupled to a first drain select line DSL1. The gates of the drain select transistors of cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string and each cell string has a linear shape.

Figure 6:
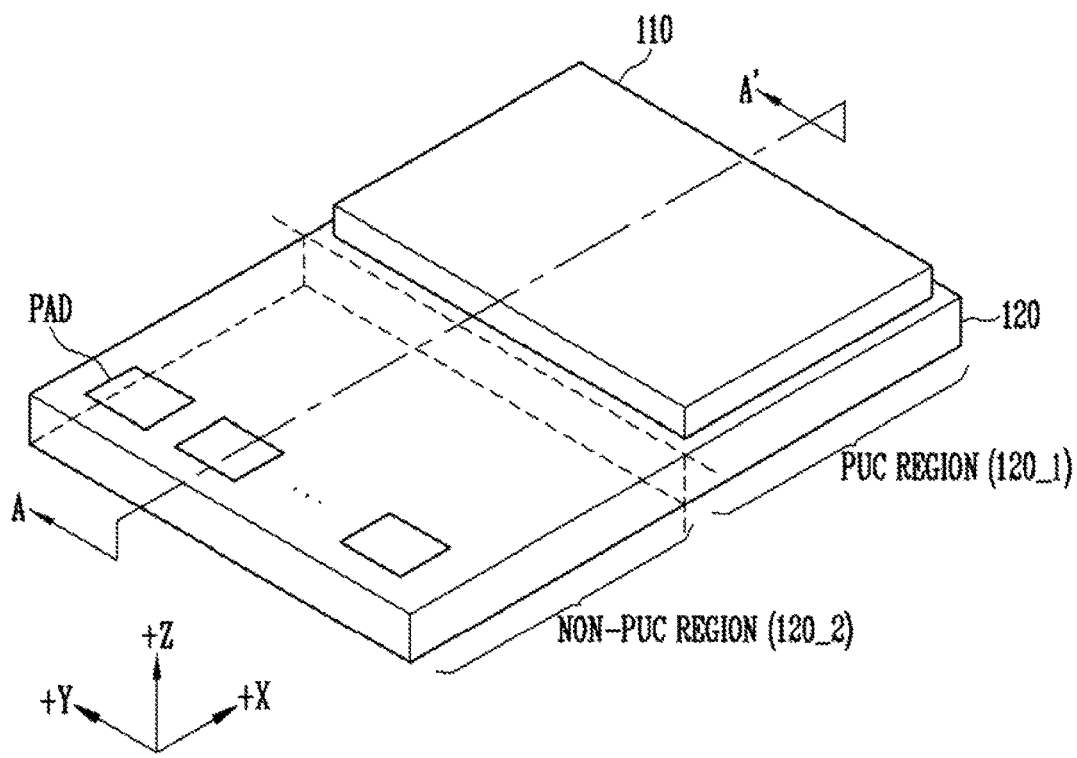
FIG. 6 is a perspective view illustrating a memory chip including the semiconductor memory device of FIG. 1, in accordance with an embodiment of the present disclosure.

FIG. 6 is a perspective view illustrating a memory chip including a semiconductor memory device, according to an embodiment of the present disclosure.

Figure 7:
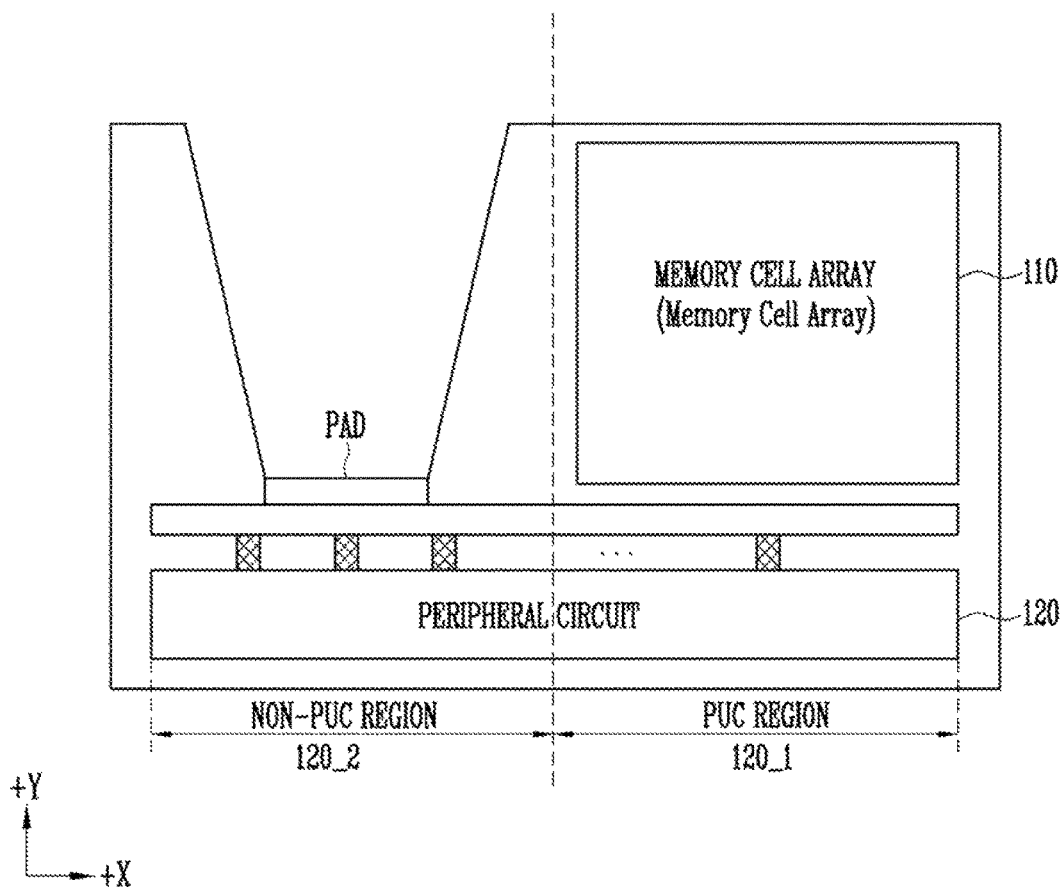
FIG. 7 is a cross-sectional view of the memory chip of FIG. 6 along line A-A'.

FIG. 7 is a cross-sectional view of the memory chip of FIG. 6 taken along line A-A' of FIG. 6.

Referring to FIGS. 6 and 7, the peripheral circuit 120 may be disposed under the memory cell array 110 when they are integrated into a semiconductor memory device. This is defined as a "peri-under cell" (PUC) structure. Although not shown, the memory cell array 110 and the peripheral circuit 120 may be coupled to each other through metal layers. A cell region metal layer may be formed over the memory cell array 110. The cell region metal layer may include a plurality of cell lines. A peripheral region metal layer may be formed over the peripheral circuit 120. The peripheral region metal layer may include a plurality of peripheral lines. The memory cell array 110 may be coupled with the cell region metal layer through a cell contact. The peripheral circuit 120 may be coupled with a peripheral region metal layer through a peripheral contact. The cell region metal layer and the peripheral region metal layer may be coupled to each other through contact between the metal layers.

The memory cell array 110 may have a three-dimensional structure (or a vertical structure). For instance, the memory cell array may be formed of a structure that is stacked in the Z direction on a plane extending in the X and Y directions. The peripheral circuit 120 has a planar structure. The peripheral circuit 120 is formed on a plane extending in the X and Y directions.

The peripheral circuit 120 may include a plurality of transistors for performing various functions. Each transistor may include a gate electrode, and source and drain regions which are symmetrically disposed based on the gate electrode.

The peripheral circuit 120 may be divided into a PUC region 120_1 and a non-PUC region 120_2. The PUC region 120_1 denotes a region of the peripheral circuit 120 that is disposed under the memory cell array 110. The non-PUC region 120_2 denotes a region of the peripheral circuit 120 that is not disposed under the memory cell array 110, in other words, a region of the peripheral circuit 120 other than the PUC region 120_1.

Referring to FIGS. 6 and 7, the memory chip may include a plurality of pads PAD. The memory chip may be coupled to an external device through the pads PAD. A command CMD, an address ADDR and data DATA provided from the external device may be transmitted to the peripheral circuit 120 through the pads PAD.

When data DATA is programmed and read, a failure may occur in the peripheral circuit 120. If the failure occurs in the non-PUC region 120_2, it is easier to take measures for remedying the failure because the memory cell array 110 is not disposed over the peripheral circuit 120 in the non-PUC region 120_2. However, if the failure occurs in the PUC region 120_1, measures for remedying the failure must be taken after the memory cell array 110 is removed, which may significantly increase the time required to perform an operation of testing the semiconductor memory device.

In an embodiment of the present disclosure, when a failure occurs in the peripheral circuit 120, it may be determined whether the failure occurred in the PUC region 120_1 or in the non-PUC region 120_2. The semiconductor memory device, in accordance with an embodiment of the present disclosure, may include a PUC fail sensing unit (not shown) provided between the PUC region 120_1 and the non-PUC region 120_2 so as to determine whether the failure has occurred in the PUC region 120_1 or the non-PUC region 120_2.

Figure 8:
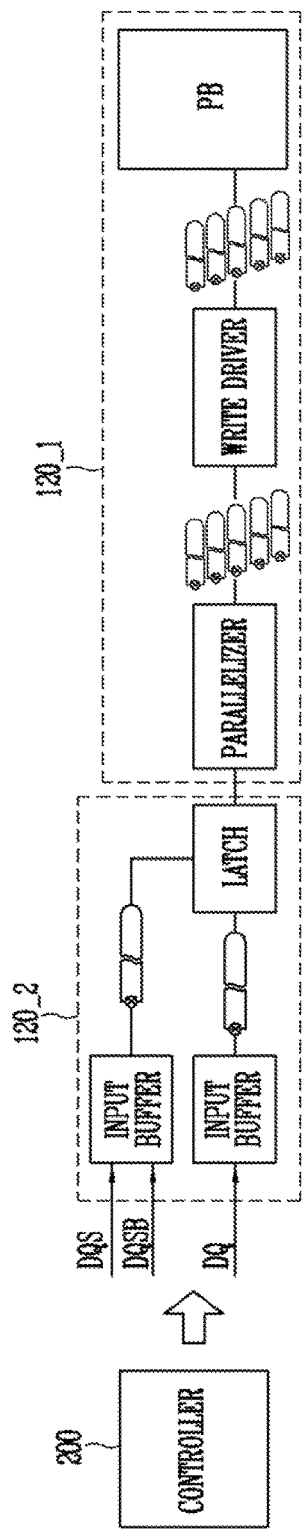
FIG. 8 is a diagram illustrating operations of a PUC region and a non-PUC region of a peripheral circuit during a program operation.

FIG. 8 is a diagram illustrating the operations of the PUC region 120_1 and the non_PUC region 120_2 of the peripheral circuit 120 during a program operation.

Referring to FIG. 8, during a program operation, the controller 200 provides the semiconductor memory device with a program command CMD, an address ADDR and program data DATA to be stored into the semiconductor memory device. The command CMD, the address ADDR and the program data DATA provided from the controller 200 may be inputted to the semiconductor memory device through a DQ line. A DQ signal including the command CMD, the address ADDR and the program data DATA may be inputted through the DQ line depending on a DQS signal and a DQSB signal, which are data strobe signals.

The DQS signal, the DQSB signal and the DQ signal may be inputted through the pads PAD described with reference to FIGS. 6 and 7.

The inputted DQS, DQSB and DQ signals are stored in a latch via an input buffer. Thereafter, data stored in the latch may be provided to a parallelizer such that the data may be inputted to bit lines of a memory cell to store the program data DATA. The write driver provides the parallelized data to the page buffer PB. The page buffer PB stores provided program data DATA in the memory cell through the corresponding bit lines.

In the embodiment of FIG. 8, the input buffer and the latch are included in the non-PUC region 120_2, whereas the parallelizer, the write driver and the page buffer are included in the PUC region 120_1. However, this configuration is provided only as an example. For example, the components included in the peripheral circuit 120 may be disposed in many other suitable configurations in the PUC and the non-PUC regions 120_1 and 120_2. Therefore, the arrangement of the various aforementioned components in the PUC and the non-PUC regions 120_1 and 120_2 is not limited to the illustrated arrangement of FIG. 8.

Figure 9:
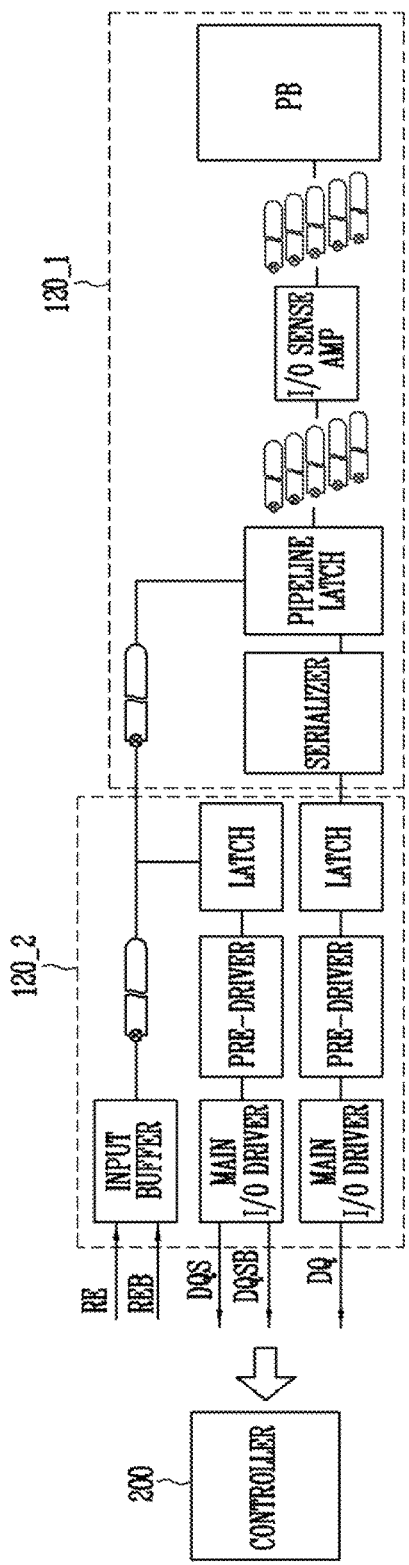
FIG. 9 is a diagram illustrating operations of the PUC region and the non-PUC region during a read operation.

FIG. 9 is a diagram illustrating the operations of the PUC region 120_1 and the non_PUC region 120_2 of the peripheral circuit 120 during a read operation.

Referring to FIG. 9, during a read operation, the controller 200 may provide a read command CMD and an address ADDR to the semiconductor memory device. The semiconductor memory device may output read data to the controller 200 according to the provided address.

In detail, the semiconductor memory device reads data of memory cells through the page buffer according to the provided address. The read data may be temporarily stored to a pipeline latch via an input/output sense AMP. The read data stored in the pipeline latch may be transferred and stored in a latch via a serializer such that it may be outputted to the controller 200. During the read operation, the controller 200 may provide an RE signal and an REB signal to the semiconductor memory device. The data stored in the latch are provided to the controller 200 through DQS, DQSB and DQ pads via a pre-driver and a main input/output driver in response to the provided RE signal and REB signal.

In the embodiment of FIG. 9, the main input/output driver, the pre-driver and the latch are included in the non-PUC region 120_2, and the serializer, the pipeline latch, the input/output sense AMP and the page buffer are included in the PUC region 120_1. However, this is only for the sake of description, and the components included in the peripheral circuit 120 may be randomly disposed in the PUC region 120_1 and the non-PUC region 120_2. Therefore, the disposition relationship in the PUC region 120_1 and the non-PUC region 120_2 are not limited by the embodiment of FIG. 9.

FIG. 10 is a diagram illustrating the operations of the PUC region 120_1 and the non-PUC region 120_2 during a program operation of the semiconductor memory device in accordance with an embodiment of the present disclosure.

FIG. 11 is a diagram illustrating the operations of the PUC region 120_1 and the non-PUC region 120_2 during a read operation of the semiconductor memory device in accordance with an embodiment of the present disclosure.

Referring to FIGS. 10 and 11, the semiconductor memory device may include a PUC fail sensing unit 130 between the PUC region 120_1 and the non-PUC region 120_2. The PUC region 120_1 and the non-PUC region 120_2 are the same as the ones described in FIGS. 8 and 9. Therefore, unnecessary repetitious descriptions will be omitted. In operation, the PUC fail sensing unit 130 may sense, in response to a PUC check enable signal PUC_Check_EN, whether a failure occurred in the PUC region 120_1 or the non-PUC region 120_2.

Before a failure occurs in the peripheral circuit 120, the PUC fail sensing unit 130 may be set as deactivated in response to the PUC check enable signal PUC_Check_EN. While the PUC fall sensing unit 130 is deactivated, the PUC fall sensing unit 130 may transfer data from the non-PUC region 120_2 to the PUC region 120_1. In this case, the PUC region 120_1 and the non-PUC region 120_2 may operate as described with reference to FIG. 8 during the program operation.

When a read failure occurs during the read operation described with reference to FIG. 9, the PUC fail sensing unit 130 is activated during a test program and test read operations according to the PUC check enable signal PUC_Check_EN.

In detail, when the PUC fail sensing unit 130 is activated during the test program operation according to the PUC check enable signal PUC_Check_EN, a test data is provided from the non-PUC region 120_2 to the PUC fail sensing unit 130. The PUC fail sensing unit 130 may temporarily store the test data in a latch included therein rather than transmitting the test data to the PUC region 120_1. Therefore, the test data may be stored in the PUC fail sensing unit 130 rather than being provided to the parallelizer of the PUC region 120_1. The PUC fail sensing unit 130 may then provide the controller 200 with a signal indicating that the program has been completed.

Subsequently, a test read operation for the test data is performed. Accordingly, the PUC fail sensing unit 130 may provide the test data stored therein to a latch included in the non-PUC region 120_2. If the test read operation passes, this would indicate that the failure occurred in the PUC region 120_1. Alternatively, if the test read operation fails, this would indicate that the failure occurred in the non-PUC region 120_2.

According to an embodiment of the present disclosure, the semiconductor memory device may sense that a failure has occurred and detect in which one of the PUC or the non-PUC regions 120_1 and 120_2 the failure occurred. Thereby, the test time of the semiconductor memory device using the PUC structure may be effectively reduced.

Figure 12:
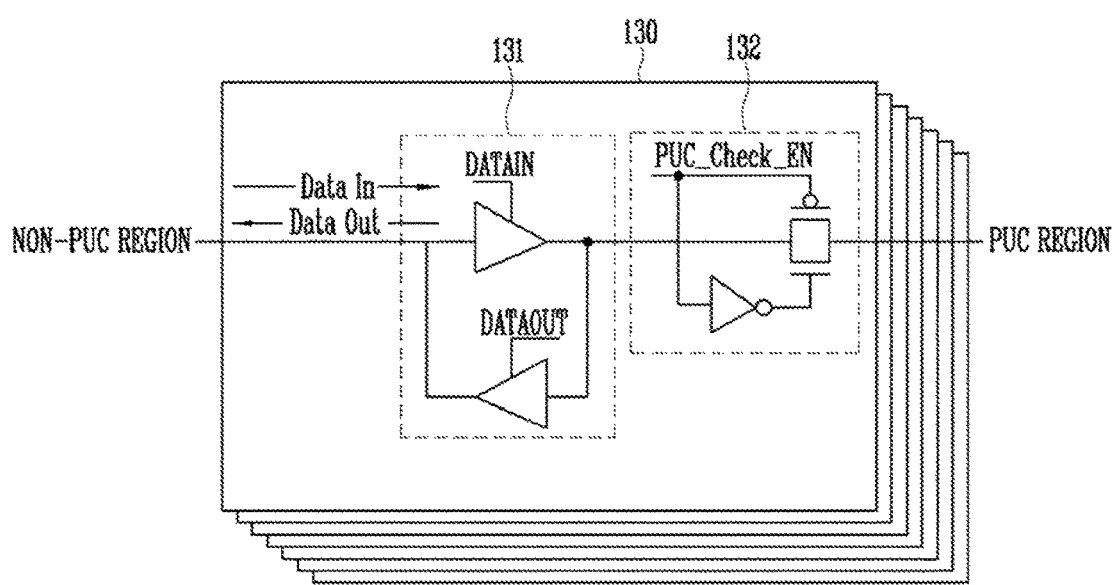
FIG. 12 is a diagram illustrating an exemplary configuration of a PUC fall sensing unit of FIGS. 10 and 11.

FIG. 12 is a diagram illustrating an exemplary configuration of the PUC fail sensing unit 130.

Referring to FIG. 12, the PUC fail sensing unit 130 may include a latch unit 131 and a PUC check control unit 132.

The latch unit 131 may store the test data provided from the non-PUC region 120_2 during the test program operation (DATA IN). Then, the latch unit 131 may provide the test data stored therein to the non-PUC region 120_2 during the test read operation (DATA OUT).

The PUC check control unit 132 may be implemented with a transmission gate, and may block data transfer between the PUC and non PUC regions 120_1 and 120_2 in response to the PUC check enable signal PUC_Check_EN. For example, when the PUC check enable signal PUC_Check_EN is high-enabled, the PUC check control unit 132 may block data transfer between the PUC region 120_1 and the non-PUC region 120_2. When the PUC check enable signal PUC_Check_EN is low-disabled, the PUC check control unit 132 may transfer data between the PUC region 120_1 and the non-PUC region 120_2.

Figure 13:
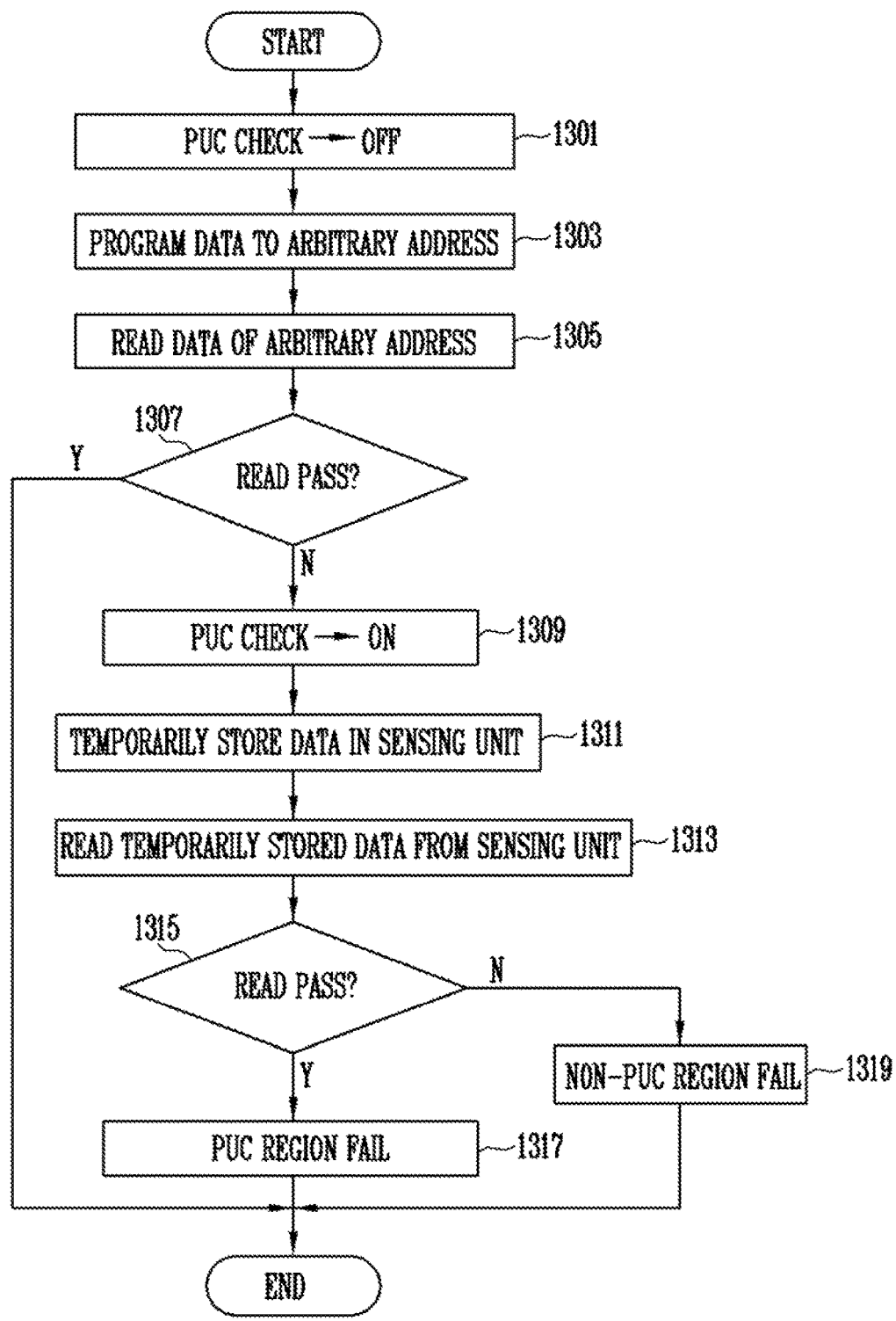
FIG. 13 is a flowchart of an operation of the semiconductor memory device, in accordance with an embodiment of the present disclosure.

FIG. 13 is a flowchart of an operation of the semiconductor memory device, in accordance with an embodiment of the present disclosure.

Referring to FIG. 13, at step 1301, the semiconductor memory device may deactivate the PUC fail sensing unit 130. For example, the semiconductor memory device may low-disable the PUC check enable signal PUC_Check_EN (PUC check→OFF) inputted to the PUC check control unit 132 in order to transfer data between the PUC region 120_1 and the non-PUC region 120_2. In the case where the PUC fail sensing unit 130 is deactivated, data may be transferred between the non-PUC region 120_2 and the PUC region 120_1.

At step 1303, the semiconductor memory device may program data according to an arbitrary address. Because the PUC fall sensing unit 130 is deactivated, the data may be stored in memory cells via the non-PUC region 120_2 and the PUC region 120_1.

At step 1305, the semiconductor memory device may read data of an arbitrary address. The semiconductor memory device may output, to the outside, the data stored in the memory cells associated with the address through the bit lines.

At step 1307, the semiconductor memory device may determine whether the read operation has passed. As a result of the determination, if the read operation has passed, the operation is finished because no failure has occurred in the semiconductor memory device. As a result of the determination at step 1307, if the read operation has failed, the process enters step 1309.

At step 1309, the semiconductor memory device may activate the PUC fail sensing unit 130 (PUC CHECK→ON). For example, the semiconductor memory device may high-enable the PUC check enable signal PUC_Check_EN inputted to the PUC check control unit 132 in order to block data transfer between the PUC region 120_1 and the non-PUC region 120_2. In the case where the PUC fail sensing unit 130 is activated, data may not be transferred between the non-PUC region 120_2 and the PUC region 120_1.

At step 1311, the semiconductor memory device may provide test data to the PUC fail sensing unit 130 through the non-PUC region 120_2. Because the PUC fail sensing unit 130 is activated, the data provided from the non-PUC region 120_2 may be temporarily stored in the latch unit included in the PUC fall sensing unit 130 without passing through the PUC region 120_1.

At step 1313, the semiconductor memory device may read the test data stored in the PUC fail sensing unit 130. The semiconductor memory device may output, as read data, the test data.

At step 1315, the semiconductor memory device may determine whether the read operation has passed. As a result of the determination, if the read operation has passed, the process enters step 1317, and if the read operation has failed, the process enters step 1319.

At step 1317, the semiconductor memory device may determine that the caused failure has occurred in the non-PUC region 120_2.

At step 1319, the semiconductor memory device may determine that the caused failure has occurred in the PUC region 120_1.

In accordance with the embodiments of the present disclosure, the semiconductor memory device may sense that a failure of the peripheral circuit has occurred in which one of the PUC region and the non-PUC region. Thereby, the test time of the semiconductor memory device using the PUC structure may be effectively reduced.

Figure 14:
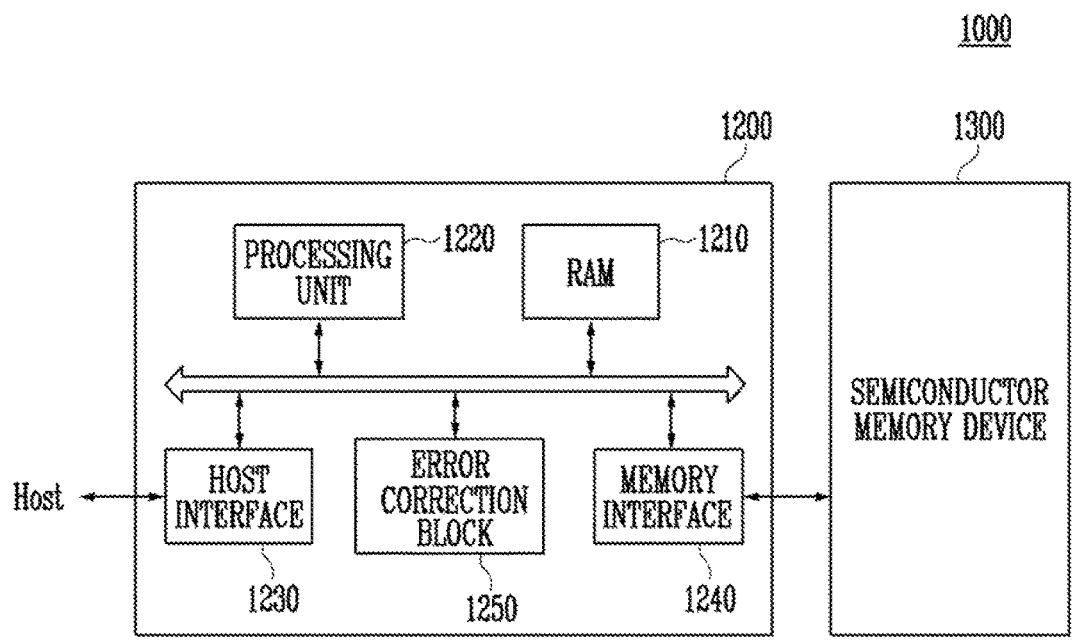
FIG. 14 is a block diagram illustrating a memory system including the semiconductor memory device of FIG. 1, in accordance with an embodiment of the present disclosure.

FIG. 14 is a block diagram showing a memory system 1000 including the semiconductor memory device of FIG. 1, according to an embodiment of the present invention.

Referring to FIG. 14, the memory system 1000 includes a semiconductor memory device 1300 and a controller 1200.

The semiconductor memory device 1300 may have the same configuration and operation as those of the semiconductor memory device described with reference to FIGS. 1 to 13. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 may include a RAM (Random Access Memory) 1210, a processing unit 1220, a host interface 1230, a memory interface 1240, and an error correction block 1250.

The RAM 1210 may be used as any one of a work memory of the processing unit 1220, a cache memory between the semiconductor memory device 1300 and the host Host, and a buffer memory between the semiconductor memory device 1300 and the host Host.

The processing unit 1220 may control an operation of the controller 1200. The processing unit 1220 may be configured to control a read operation, a program operation, an erase operation and a background operation of the semiconductor memory device 1300. The memory control unit 1220 may be configured to run firmware for controlling the semiconductor memory device 100. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 may be configured to randomize data received from the Host. For example, the processing unit 1220 may use a randomizing seed to randomize data received from the Host. The randomized data may be provided, as data to be stored, to the semiconductor memory device 1300 and may be then programmed in the memory cell array.

The processing unit 1220 is configured to derandomize data received from the semiconductor memory device 1300 during a read operation. For example, the processing unit 1220 may use a derandomizing seed to derandomize data received from the semiconductor memory device 1300. Derandomized data may be output to the host Host.

In an embodiment, the processing unit 1220 may drive software or firmware to perform the randomizing or derandomizing operation.

The host interface 1230 may include a protocol for performing data exchange between the host Host and the controller 1200. In an exemplary embodiment, the controller 1200 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 may interface with the semiconductor memory device 1300. For example, the memory interface 1240 may include a NAND interface or NOR interface.

The error correction block 1250 may be configured to use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD may include a storage device configured to store data in a semiconductor memory. When the memory system is used as the SSD, an operation speed of the host Host coupled to the memory system may be improved significantly.

In another embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1300 or the memory system may be embedded in various types of packages. For example, the semiconductor memory device 1300 or the memory system may be packaged as a Package on Package (PoP), a Ball grid arrays (BGAs), Chip scale packages (CSPs), a Plastic Leaded Chip Carrier (PLCC), a Plastic Dual In Line Package (PDIP), a Die in Waffle Pack, Die in Wafer Form, a Chip On Board (COB), a Ceramic Dual In Line Package (CERDIP), a Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a Thin Quad Flatpack (TQFP), System In Package (SIP), Multi-Chip Package (MCP), a Wafer-level Fabricated Package (WFP), a Wafer-Level Processed Stack Package (WSP), or the like.

Figure 15:
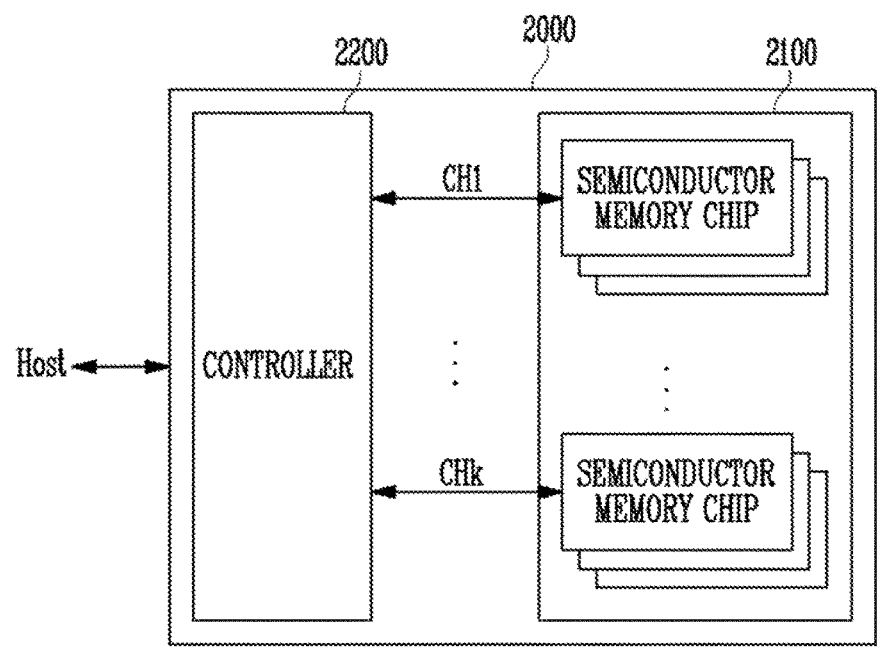
FIG. 15 is a block diagram illustrating an application of the memory system of FIG. 14, in accordance with an embodiment of the present disclosure.

FIG. 15 is a block diagram showing an application of the memory system of FIG. 14.

Referring to FIG. 15, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 15, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 14.

Each group may communicate with the controller 2200 through one common channel. The controller 2200 may have the same configuration as that of the controller 1200 described with reference to FIG. 14 and may be configured to control the plurality of memory chips of the semiconductor memory device 2100 through the plurality of channels CH1 to CHk.

In FIG. 15, a description has been made such that a plurality of semiconductor memory chips are coupled to a single channel. However, it will be understood that the memory system 2000 may be modified such that a single semiconductor memory chip is coupled to a single channel.

Figure 16:
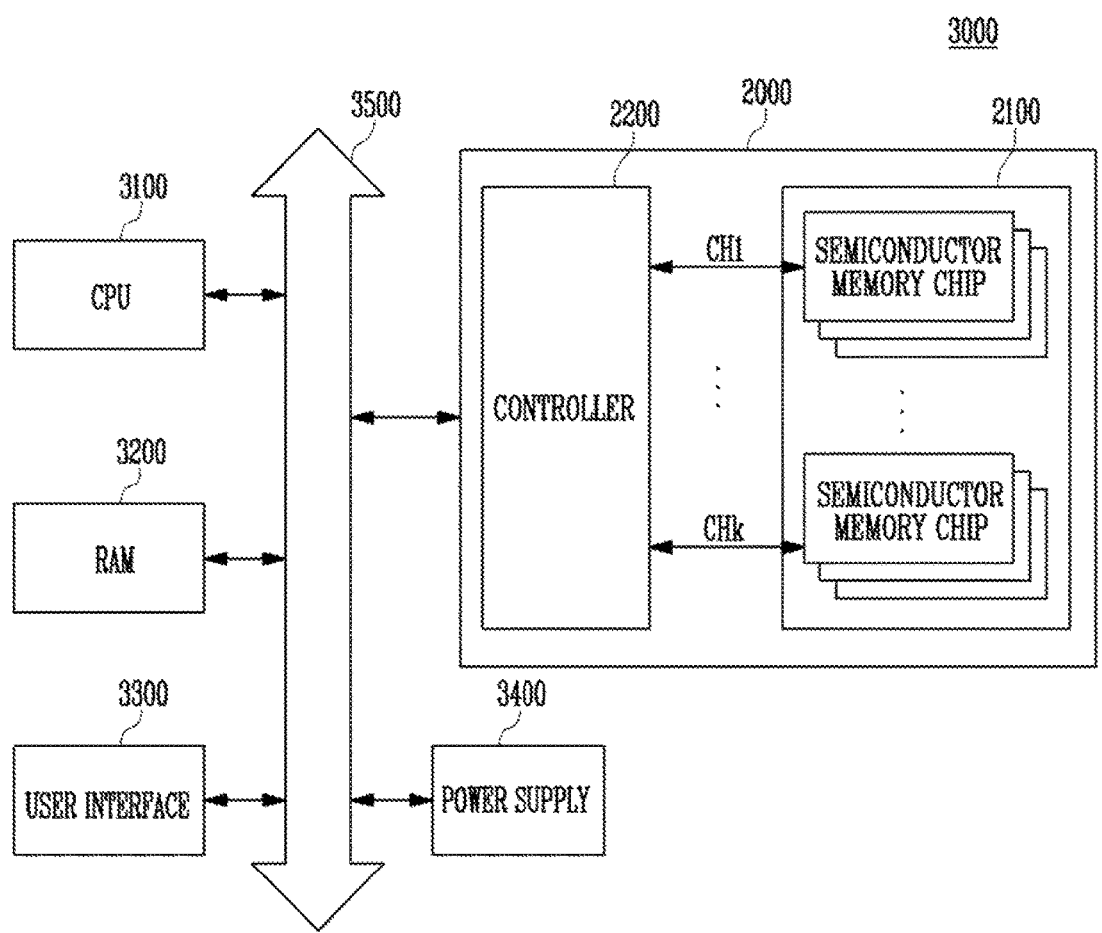
FIG. 16 is a block diagram illustrating a computing system including the memory system described with reference to FIG. 15, in accordance with an embodiment of the present disclosure.

FIG. 16 is a block diagram showing a computing system including the memory system described with reference to FIG. 15.

Referring to FIG. 16, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 16, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 16, the memory system 2000 described with reference to FIG. 15 is illustrated as being provided. However, the memory system 2000 may be replaced with the memory system 1000 described with reference to FIG. 14. In an embodiment, the computing system 3000 may be configured to include all of the memory systems 1000 and 2000 described with reference to FIGS. 14 and 15.

In accordance with the embodiments of the present disclosure, there are provided a semiconductor memory device which may sense a failure of a certain region in a peripheral circuit, and a method of operating the semiconductor memory device.

Although exemplary embodiments of the present invention have been disclosed, those skilled in the art will appreciate that various modifications, additions and substitutions are possible, without departing from the scope and spirit of the invention as defined by the appended claims and equivalents of the claims.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present invention. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
a memory cell array including a plurality of memory cells;
a peripheral circuit configured to control the memory cell array, the peripheral circuit including a first region disposed under the memory cell array and a second region; and
a fail sensing unit configured to sense whether a failure has occurred in the first or the second regions,
wherein the fail sensing unit comprises:
a latch unit configured to temporarily store data provided through the second region; and
a fail control unit configured to block data transfer between the first and second regions in response to a control signal,
wherein the fail sensing unit outputs the temporarily-stored data to the second region in response to a read command, and
wherein the failure is present in the second region when a response of the read command fails.

2. The semiconductor memory device of claim 1, wherein the fail sensing unit is disposed between the first region and the second region.

3. The semiconductor memory device of claim 1, wherein the fail sensing unit transfers data from the second region to the first region when the fail sensing unit is deactivated.

4. The semiconductor memory device of claim 1, wherein the fail sensing unit temporarily stores data provided from the second region when the fail sensing unit is activated.

5. The semiconductor memory device of claim 1, wherein the fail sensing unit blocks data transfer between the first and second regions when the fail sensing unit is activated.

6. The semiconductor memory device of claim 1,
wherein the fail sensing unit is activated and blocks data transfer between the first and second regions when the control signal has a first level, and
wherein the fail sensing unit is deactivated and transfers data between the first and second regions when the control signal has a second level.

7. The semiconductor memory device of claim 1, wherein the failure is present in the first region when a response of the read command passes.

8. The semiconductor memory device of claim 1, wherein the memory cell array is a three-dimensional nonvolatile memory cell array.

9. The semiconductor memory device of claim 1, wherein the memory cell array is a flash memory array.

10. A method of operating a semiconductor memory device, including a memory cell array and a peripheral circuit having a first region disposed under the memory cell array and a second region and configured to control the memory cell array, the method comprising:
performing a first program operation to program first program data to selected memory cells included in the memory cell array;
performing a first read operation of reading data from a selected memory cell;
performing a second program operation to program second program data to the selected memory cells;
performing a second read operation for the selected memory cells; and
determining that the failure is present in the second region, when the second read operation fails.

11. The method of claim 10, further comprising determining that the failure is present in the first region, when the second read operation passes.

12. The method of claim 10, wherein the performing the first program operation comprises storing the first program data from the second region to the selected memory cells through the first region.

13. The method of claim 10, wherein the performing the second program operation comprises temporarily storing the second program data in a latch disposed between the first and second regions.

* * * * *